(12) United States Patent
Fowler

(10) Patent No.: US 8,446,722 B2
(45) Date of Patent: May 21, 2013

(54) CIRCUIT BOARD CHASSIS AND METHOD INCLUDING SIDEWALL APERTURE AND BACKPLANE INSERTION SLOTS FOR SIDE ASSEMBLED BACKPLANE

(75) Inventor: Michael L. Fowler, Minoa, NY (US)

(73) Assignee: SRC, Inc., North Syracuse, NY (US)

( * ) Notice: Subject to any disclaimer, the term of this patent is extended or adjusted under 35 U.S.C. 154(b) by 337 days.

(21) Appl. No.: 12/879,604

(22) Filed: Sep. 10, 2010

(65) Prior Publication Data
US 2012/0063084 A1 Mar. 15, 2012

(51) Int. Cl.
H05K 7/20 (2006.01)

(52) U.S. Cl.
USPC ............ 361/690; 361/715; 361/741; 361/756

(58) Field of Classification Search
USPC .......................... 361/715, 727, 741, 756, 788
See application file for complete search history.

(56) References Cited

U.S. PATENT DOCUMENTS

| | | | |
|---|---|---|---|
| 4,480,287 A | | 10/1984 | Jensen |
| 4,486,816 A | * | 12/1984 | Hope ............................ 361/756 |
| 4,546,407 A | * | 10/1985 | Benenati ....................... 361/716 |
| 4,656,559 A | * | 4/1987 | Fathi ............................ 361/721 |
| 4,775,260 A | | 10/1988 | Kecmer |
| 4,819,713 A | | 4/1989 | Weisman |
| 4,829,402 A | * | 5/1989 | Gewebler et al. ............. 361/692 |
| 5,051,871 A | * | 9/1991 | Heng et al. .................... 361/801 |
| 5,200,882 A | | 4/1993 | Blomquist |
| 5,424,916 A | * | 6/1995 | Martin .......................... 361/698 |
| 5,528,464 A | | 6/1996 | Hamaguchi et al. |
| 5,539,616 A | * | 7/1996 | Kikinis .................... 361/679.41 |
| 5,949,650 A | | 9/1999 | Bulante et al. |
| 6,144,556 A | * | 11/2000 | Lanclos ........................ 361/695 |
| 6,261,104 B1 | | 7/2001 | Leman |
| 6,285,564 B1 | | 9/2001 | O'Brien |
| 6,323,423 B1 | | 11/2001 | Tirrell et al. |
| 6,373,712 B1 | | 4/2002 | Bailis et al. |
| 6,434,018 B1 | | 8/2002 | Waltz |
| 6,735,093 B2 | | 5/2004 | Mu-Tsai |
| 6,765,798 B1 | | 7/2004 | Ratliff et al. |
| 6,987,674 B2 | | 1/2006 | El-Batal et al. |
| 7,068,498 B2 | | 6/2006 | Bolich et al. |

(Continued)

OTHER PUBLICATIONS

Series 40 Wedge-Lok® Series 40, Butcher Products website, http://www.birtcherproducts.com/PDF/DATASHEETS/Wedge-Lok-series%2040-three%20piece.pdf.

(Continued)

Primary Examiner — Gregory Thompson
(74) Attorney, Agent, or Firm — George R. McGuire; Bond Schoeneck & King, PLLC

(57) ABSTRACT

A circuit board chassis and a method for assembling a backplane and a circuit board into the circuit board chassis include an aperture within at least one sidewall of the circuit board chassis. The backplane is inserted and assembled into the circuit board chassis through the aperture (that may include a counter-opposed pair of backplane insertion and assembly slots) in a first direction, and a circuit board is inserted and assembled into the circuit board chassis and the backplane in a second direction perpendicular to the first direction. By inserting and assembling the backplane into the aperture and slots, rather than assembling the backplane as an external surface component of the circuit board chassis, the embodiments provide for ease of replacement of the backplane and circuit board under space constrained limitations. The resulting embodiments also provide enhanced rigidity and enhanced thermal dissipation within the circuit board chassis.

19 Claims, 7 Drawing Sheets

U.S. PATENT DOCUMENTS

| | | | |
|---|---|---|---|
| 7,212,412 B2 | 5/2007 | Carlson et al. | |
| 7,349,221 B2 | 3/2008 | Yurko | |
| 8,009,431 B2* | 8/2011 | Sun et al. | 361/727 |
| 8,035,964 B2* | 10/2011 | Biagini et al. | 361/690 |
| 2006/0152904 A1* | 7/2006 | Chuang | 361/703 |

OTHER PUBLICATIONS

2009 Calmark Catalog, Calmark Corporation website, http:/viewer.zmags.com/publication/cddb94af#/cddb94af/1.

* cited by examiner

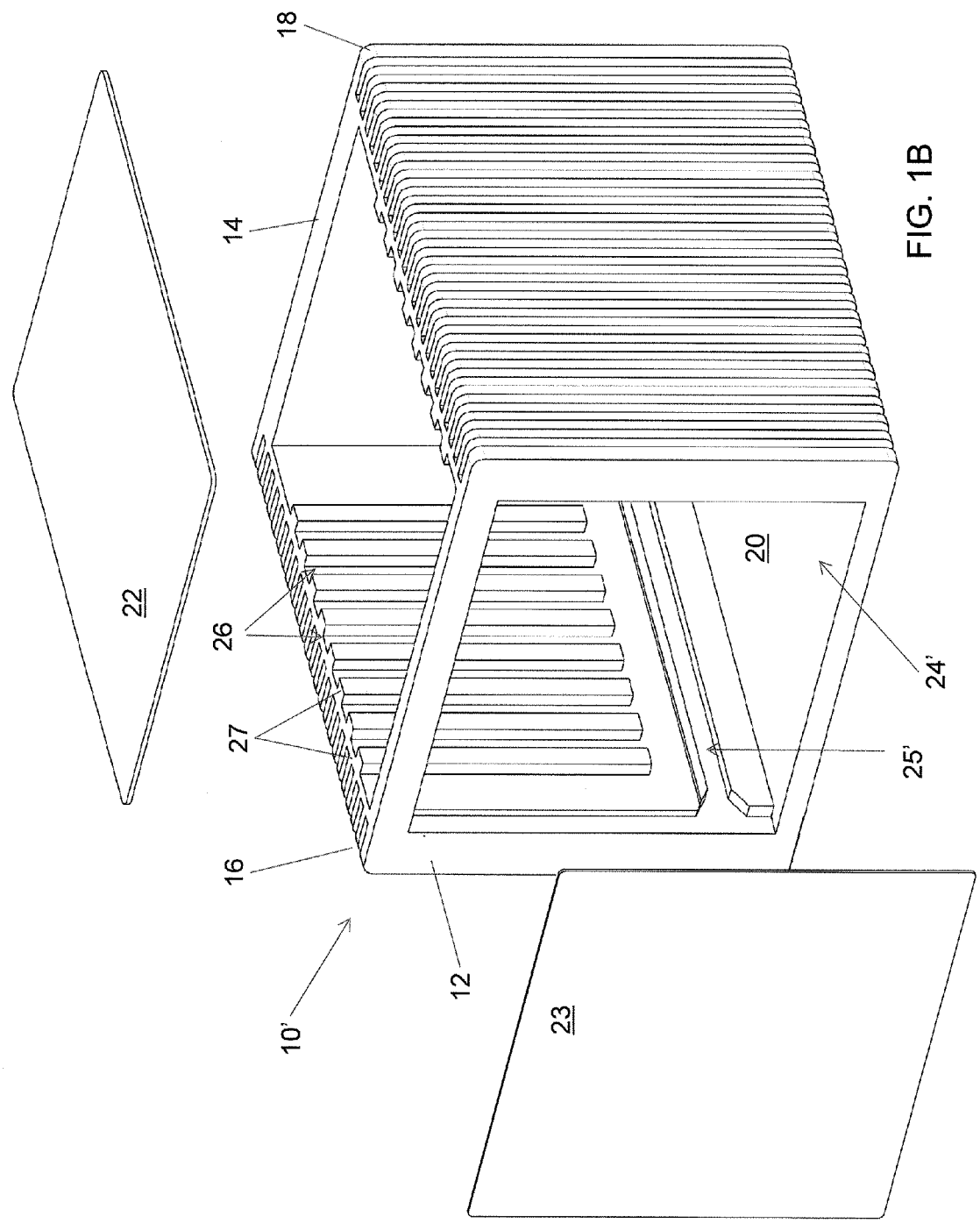

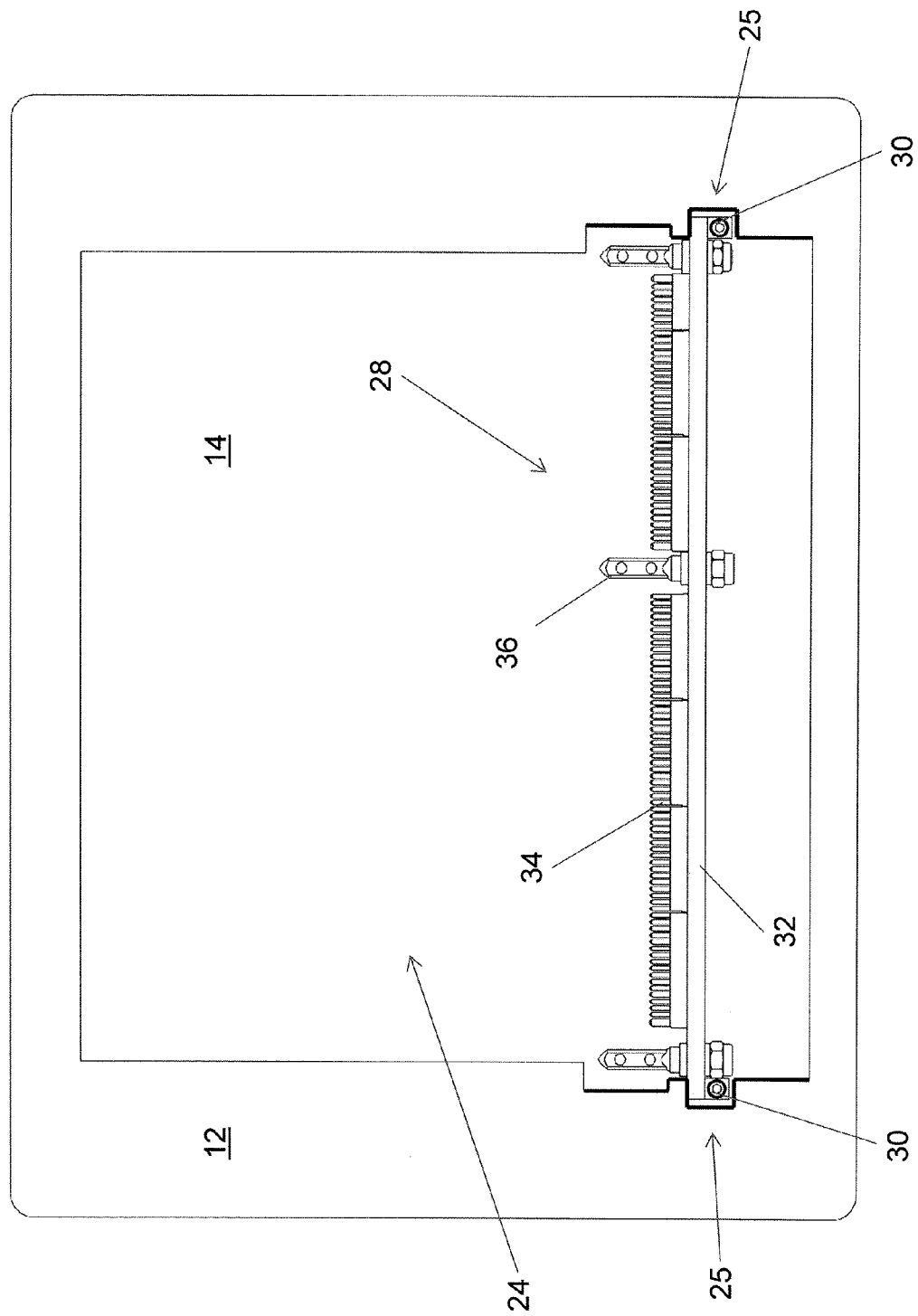

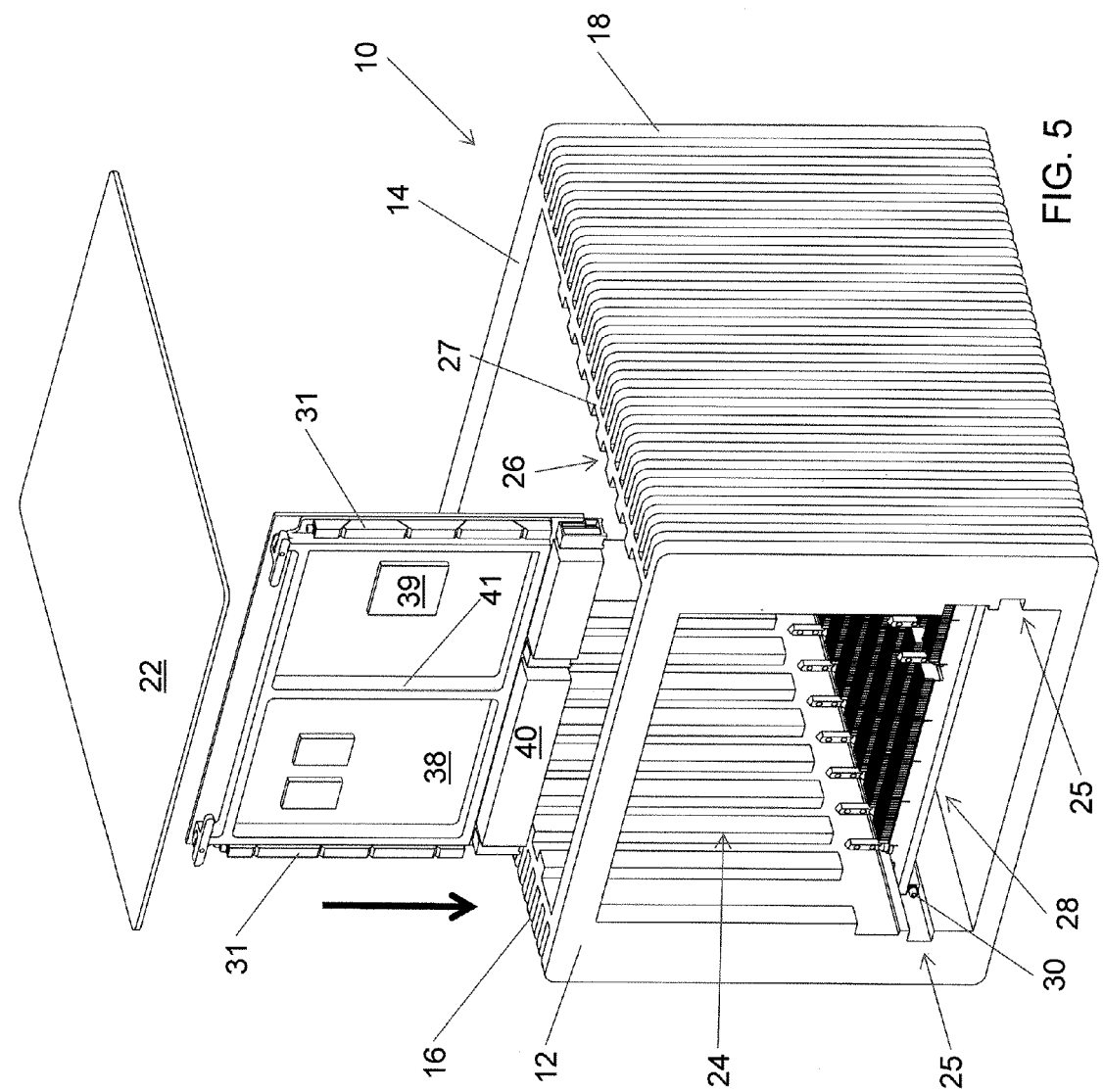

CIRCUIT BOARD CHASSIS AND METHOD INCLUDING SIDEWALL APERTURE AND BACKPLANE INSERTION SLOTS FOR SIDE ASSEMBLED BACKPLANE

BACKGROUND

1. Field of the Invention

The invention relates generally to circuit board chassis. More particularly, the invention relates to circuit board chassis that permit flexible insertion and assembly of backplanes and circuit boards into the circuit board chassis.

2. Description of the Related Art

In order to effectively realize enhanced functionality of advanced microelectronic circuits, circuit components that comprise those advanced microelectronic circuits are typically assembled to a circuit board. Such a circuit board typically further comprises a plurality of conductor layers that are separated by a plurality of dielectric layers so that a plurality of circuit components may be electrically interconnected. To provide further advanced functionality, individual circuit boards (which are often designated as "daughter boards") may be further connected and interconnected using a backplane (which is often designated as a "motherboard").

Finally, for purposes of environmental protection, as well as to facilitate proper assembly of a plurality of circuit boards with respect to a backplane, both the backplane and the plurality of circuit boards are positioned and assembled with respect to each other using a chassis that may also function as an environmental enclosure.

While the use of such a chassis or environmental enclosure is common within the electronics packaging and component assembly art, the use of such a chassis or environmental enclosure is not entirely without problems. In that regard, assembly of a backplane and a plurality of circuit boards into a chassis or environmental enclosure may present difficulties under circumstances where the chassis or environmental enclosure is located within a space constrained area. Such circumstances are often prevalent within the context of chassis or environmental enclosures that are intended for military, avionics or seaworthy applications.

Various circuit board chassis and related assemblies are known in the electronics packaging and component assembly arts.

For example, O'Brien, in U.S. Pat. No. 6,285,564, teaches a circuit board retainer assembly which when attached to a circuit board allows the circuit board to slide freely within a slot within a circuit board chassis. This particular circuit board retainer assembly is self contained, and includes a mechanism to prevent accidental disassembly.

In addition, Tirrell et al., in U.S. Pat. No. 6,323,423, teaches a circuit board chassis suitable for interconnected circuit boards. This particular circuit board chassis includes a movable ceiling panel and a movable floor panel that provide for installation of backplanes of various thicknesses.

Finally, El-Batal et al., in U.S. Pat. No. 6,987,694, teaches a disk storage system that includes removable arrays of disk drives. Within this particular disk storage system, the removable arrays of disk drives are located upon multiple backplanes that are inserted into a chassis.

Desirable are circuit board chassis and circuit board enclosures that allow for flexible installation and assembly of backplanes and circuit boards into those circuit board chassis and circuit board enclosures, particularly under space constrained limitations.

SUMMARY

The embodiments provide a plurality of circuit board chassis into which may be assembled at least one backplane and at least one circuit board under space constrained limitations. The embodiments further include a method for assembling the at least one backplane and the at least one circuit board into the plurality of circuit board chassis under the space constrained limitations.

The embodiments realize the foregoing objects by including within a sidewall of the circuit board chassis an aperture into which a backplane may be inserted and assembled into the circuit board chassis. Typically, a counter-opposed pair of sidewalls of the aperture may also include a counter-opposed pair of slots that extend into the circuit board chassis. The counter-opposed pair of slots is intended to accommodate insertion and assembly of the at least one backplane into the circuit board chassis. By using such a sidewall aperture and related counter-opposed pair of slots for insertion and assembly of the at least one backplane into the circuit board chassis, rather than an external surface assembly of the at least one backplane to the circuit board chassis by means of a plurality of mechanical fasteners, the embodiments provide for insertion and assembly of a backplane into a circuit board chassis under space constrained limitations. Such insertion and assembly of the backplane under space constrained limitations is effected absent a need for moving the circuit board chassis, or gaining access to a rear or bottom of the circuit board chassis, to assemble the at least one backplane or replace the at least one backplane.

The embodiments provide several additional and supplemental advantages within the context of the circuit board chassis when inserting and assembling a backplane through a sidewall aperture that includes a counter-opposed pair of slots in the circuit board chassis, rather than using an external surface assembly of the backplane or replacement of the backplane. These additional supplemental advantages include: (1) superior mechanical integrity of the circuit board chassis and backplane assembly using the sidewall aperture and related counter-opposed slots; (2) reduced backplane assembly time with the sidewall aperture and related counter-opposed slots due to elimination of a plurality of mechanical fasteners, such as but not limited to screws; and (3) superior heat transfer of the circuit board chassis and backplane assembly using the sidewall aperture and related counter-opposed slots, in comparison with a backplane that is assembled with the plurality of mechanical fasteners, such as but not limited to screws, as an external surface assembly of the backplane to the circuit board chassis.

The foregoing additional advantages are realized in particular under circumstances where the inventive insertion and assembly of a backplane into a circuit board chassis through a sidewall aperture further including a counter-opposed pair of slots is effected using linear clamping devices such as but not limited to wedge-lock type clamping devices, in comparison with outer surface assembly of a backplane to a circuit board chassis which is typically effected using a plurality of mechanical fasteners, such as but not limited to screw type fasteners.

A particular circuit board chassis in accordance with the invention includes an enclosure comprising a first sidewall and a second sidewall that are counter-opposed, and connected to and separated by a third sidewall and a fourth sidewall that are counter-opposed, and connected to and separated by the first sidewall and the second sidewall. At least one of the first sidewall, the second sidewall, the third sidewall and the fourth sidewall includes an aperture to accommodate insertion and assembly of a backplane into the circuit board chassis in a first direction through the aperture. This particular circuit board chassis also includes at least one circuit board guide means incorporated into at least one of the first sidewall, the second sidewall, the third sidewall, the fourth sidewall and the backplane to accommodate insertion and assembly of a circuit board into the circuit board chassis and the backplane in a second direction perpendicular to the first direction.

Another particular circuit board chassis in accordance with the invention includes an enclosure comprising a first sidewall and a second sidewall that are counter-opposed, and connected to and separated by a third sidewall and a fourth sidewall that are counter-opposed, and connected to and separated by the first sidewall and the second sidewall. At least one of the first sidewall, the second sidewall, the third sidewall and the fourth sidewall includes an aperture further including a counter-opposed pair of backplane insertion and assembly slots that extend into the circuit board chassis to accommodate insertion and assembly of a backplane into the circuit board chassis in a first direction through the aperture. This particular circuit board chassis also includes at least one circuit board guide slot incorporated into at least one of the first sidewall, the second sidewall, the third sidewall and the fourth sidewall to accommodate insertion and assembly of a circuit board into the circuit board chassis and the backplane in a second direction perpendicular to the first direction.

A particular method for assembling a backplane and a circuit board into a circuit board chassis includes inserting a backplane in a first direction through an aperture within a first sidewall within a circuit board chassis comprising: (1) an enclosure comprising the first sidewall and a second sidewall that are counter-opposed, and connected to and separated by a third sidewall and a fourth sidewall that are counter-opposed, and connected to and separated by the first sidewall and the second sidewall, the first sidewall including the aperture to accommodate insertion and assembly of the backplane into the circuit board chassis in the first direction through the aperture; and (2) at least one circuit board guide means incorporated into at least one of the first sidewall, the second sidewall, the third sidewall and the fourth sidewall to accommodate insertion and assembly of a circuit board into circuit board chassis and the backplane in a second direction perpendicular to the first direction. This particular method also includes inserting and assembling the circuit board into the circuit board chassis and the backplane in the second direction perpendicular to the first direction.

Within the instant disclosure, a "circuit board chassis" is intended as a chassis or enclosure to which is assembled at least one backplane and at least one circuit board. A circuit board chassis in accordance with the embodiments may be fully enclosed by use of appropriately sized covers, or alternatively only partially enclosed.

Within the instant disclosure, a "backplane" is intended as a primary circuit board to which other circuit boards are attached and assembled within a circuit board chassis. A backplane in accordance with the invention may alternatively be referred to as a "motherboard."

Within the instant disclosure, a "circuit board" is intended as a secondary circuit board which is attached to and assembled to a backplane within a circuit board chassis. A circuit board in accordance with the embodiment and the invention may alternatively be referred to as a "daughterboard."

Within the instant disclosure, an "aperture" is intended as an opening extending completely through a sidewall of a circuit board chassis to permit insertion and assembly of a backplane into the circuit board chassis through the aperture.

Within the instant disclosure, a "slot" is intended as a groove or related structure: (1) optionally within a sidewall of an aperture, but extending into a circuit board chassis for insertion and assembly of a backplane into the circuit board chassis (i.e., a counter-opposed pair of backplane insertion and assembly slots); or (2) within an interior portion of a sidewall for insertion and assembly of a circuit board into the circuit board chassis and the backplane (i.e., a circuit board insertion and assembly slot).

BRIEF DESCRIPTION OF THE DRAWINGS

The objects, features and advantages of the invention are understood within the context of the Detailed Description of the Embodiments, as set forth below. The Detailed Description of the Embodiments is understood within the context of the accompanying drawings, that form a material part of this disclosure, wherein:

FIG. 1B shows a schematic isometric-view diagram of a circuit board chassis in accordance with another embodiment of the invention.

FIG. 4 shows an end-view diagram of the circuit board chassis of FIG. 3 after having completely inserted and assembled therein the backplane and wedge lock assemblies of FIG. 2A and FIG. 2B.

FIG. 5 shows a schematic isometric-view diagram of the circuit board chassis of FIG. 3, but further illustrating an additional insertion and assembly of a circuit board into the circuit board chassis after inserting and assembling the backplane into the circuit board chassis.

DETAILED DESCRIPTION OF THE EMBODIMENTS

The embodiments, which include a plurality of circuit board chassis and a method for assembling at least one backplane and at least one circuit board into the plurality of circuit board chassis, are understood within the context of the description set forth below. The description set forth below is understood within the context of the drawings described above. Since the drawings are intended for illustrative purposes, the drawings are not necessarily drawn to scale.

Figure 1A:
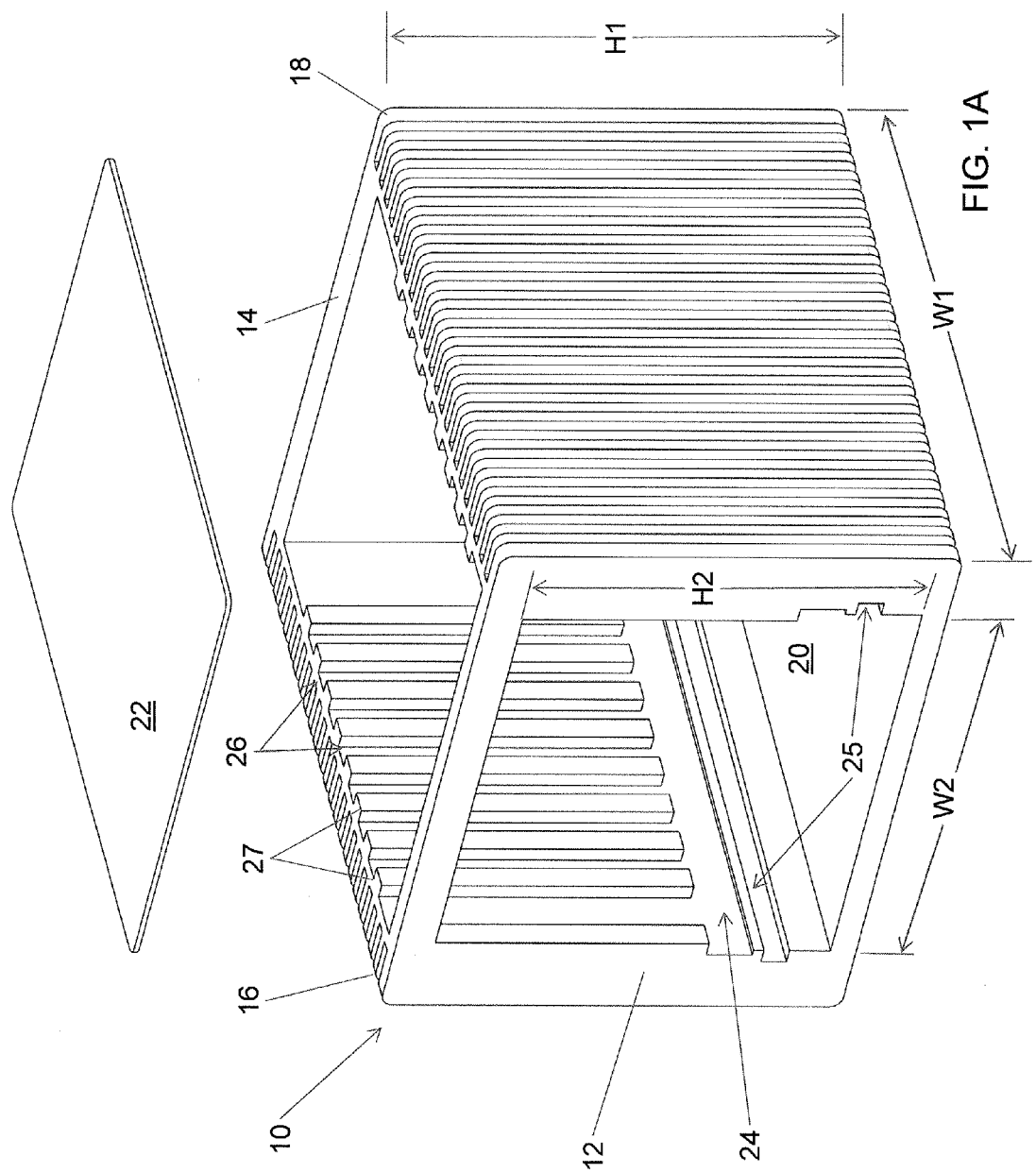
FIG. 1A shows a schematic isometric-view (i.e., perspective-view) diagram of a circuit board chassis in accordance with an embodiment of the invention.

FIG. 1A shows an isometric-view diagram of a circuit board chassis in accordance with a particular embodiment of the invention.

FIG. 1A shows generally a circuit board chassis 10 that comprises a first sidewall 12 and a second sidewall 14 that are counter-opposed, and separated by and connected to a third sidewall 16 and a fourth sidewall 18 that are similarly counter-opposed, and separated by and connected to the first sidewall 12 and the second sidewall 14. Within FIG. 1A, the first sidewall 12 includes an aperture 24 that further includes a counter-opposed pair of backplane insertion and assembly slots 25 in a pair of opposite sidewalls of the aperture 24. The counter-opposed pair of backplane insertion and assembly slots 25 extends into the circuit board chassis 10.

Thus, the first sidewall 12, the second sidewall 14, the third sidewall 16 and the fourth sidewall 18 form in a first instance an open ended tubular rectangular enclosure, where the first sidewall 12 further includes the aperture 24. For a more complete enclosure of the open ended tubular rectangular enclosure formed by the first sidewall 12, the second sidewall 14, the third sidewall 16 and the fourth sidewall 18, the circuit board chassis 10 that is illustrated in FIG. 1A also optionally includes: (1) a bottom plate 20 (i.e., attached to one end of the first sidewall 12, the second sidewall 14, the third sidewall 16 and the fourth sidewall 18); and (2) a cover plate 22 (i.e., attached to an other opposite end of the first sidewall 12, the second sidewall 14, the third sidewall 16 and the fourth sidewall 18). To finalize enclosure of the circuit board chassis 10, FIG. 1B shows an aperture cover 23 which is intended to cover the aperture 24.

Each of the foregoing sidewall components (i.e., the first sidewall 12, the second sidewall 14, the third sidewall 16 and the fourth sidewall 18) that comprise the circuit board chassis 10 that is illustrated in FIG. 1A, as well as the optional bottom plate 20, the optional cover plate 22 and the optional aperture cover 23, may comprise materials, and be formed and fabricated to dimensions, that are otherwise generally conventional in the circuit board chassis and circuit board enclosure design and fabrication art.

Typically and preferably, each of the first sidewall 12, the second sidewall 14, the third sidewall 16 and the fourth sidewall 18 comprises a thermally conductive material, such as but not limited to a metal or a metal alloy material, that is generally suitable for fabricating the first sidewall 12, the second sidewall 14, the third sidewall 16 and the fourth sidewall 18. Suitable metals and metal alloy materials may include, but are not necessarily limited to, aluminum and aluminum alloys, iron and iron alloys, stainless steel and stainless steel alloys, copper and copper alloys, and titanium and titanium alloys. Thermally conductive composites and related materials are also not excluded for fabricating the first sidewall 12, the second sidewall 14, the third sidewall 16 and the fourth sidewall 18.

Typically and preferably, each of the first sidewall 12, the second sidewall 14, the third sidewall 16 and the fourth sidewall 18 has a height dimension H1 (i.e., interposed between the bottom plate 20 and the cover plate 22) from about 15 to about 40 centimeters and a width dimension W1 (i.e., in the plane of the pertinent sidewall and perpendicular to the height dimension H1) from about 15 to about 60 centimeters that correlates with the height and width dimensions of a backplane and circuit boards that are intended to be assembled into the circuit board chassis 10. Typically, the height dimension H1 and the width dimension W1 of the first sidewall 12, the second sidewall 14, the third sidewall 16 and the fourth sidewall 18 are sized to provide an internal volume of the circuit board chassis 10 adequate to accommodate at least one backplane, and from about 2 to about 21 circuit boards.

Typically and preferably, each of the first sidewall 12, the second sidewall 14, the third sidewall 16 and the fourth sidewall 18 has a thickness that is also otherwise generally conventional in the circuit board chassis and circuit board enclosure design and fabrication art. Such a non-limiting thickness is typically from about 3 to about 25 millimeters.

The bottom plate 20, the cover plate 22 and the aperture cover 23 may be formed and fabricated from the same or different materials in comparison with the first sidewall 12, the second sidewall 14, the third sidewall 16 and the fourth sidewall 18. Commonly the bottom plate 20, the cover plate 22 and the aperture cover 23 comprise the same material from which is comprised the first sidewall 12, the second sidewall 14, the third sidewall 16 and the fourth sidewall 18, but such is not intended as a limitation of this particular embodiment, or of the invention.

The aperture 24 is intended to provide for insertion and assembly of a backplane into the circuit board chassis 10 of FIG. 1A absent the aperture cover 23, and with or without the bottom plate 20 and the cover plate 22. Thus, the aperture 24 will typically have a height dimension H2 from about 0.5 to about 2.0 centimeters and a width dimension W2 from about 10 to about 55 centimeters, as is needed to accommodate a particular backplane. However, FIG. 1 illustrates a generally greater height to the aperture 24 than might nominally be expected as needed for a particular backplane. This particular additional height provides for a clearer view of the interior of the circuit board chassis 10 of FIG. 1A, which as noted above is not necessarily drawn to scale.

Although FIG. 1A illustrates the aperture 24 as located and formed within the first sidewall 12, as is common within the instant embodiment, the embodiment is not intended to be so limited. Rather, the embodiment also contemplates that an aperture, such as the aperture 24, may be located and formed within at least one of the first sidewall 12, the second sidewall 14, the third sidewall 16 and the fourth sidewall 18 for purposes of insertion and assembly of a backplane into the circuit board chassis 10 whose schematic isometric-view diagram is illustrated in FIG. 1A.

FIG. 1A also illustrates a plurality (i.e., a pair) of counter-opposed backplane insertion and assembly slots 25 located and formed into a counter-opposed pair of sidewalls of the aperture 24. As is illustrated within FIG. 1A, the counter-opposed pair of backplane insertion and assembly slots 25 extends into the circuit board chassis 10 and includes a portion of the third sidewall 16 and (by implication) the fourth sidewall 18. As will be illustrated in greater detail below, the counter-opposed pair of backplane insertion and assembly slots 25 provides for ease in insertion and assembly of a backplane through the aperture 24 and into the circuit board chassis 10 through the aperture 24.

FIG. 1A also illustrates a plurality of circuit board insertion and assembly slots 26 located and formed interposed between a plurality of ribs 27 located and formed into interior portions of third sidewall 16 and the fourth sidewall 18, but not the first sidewall 12 and the second sidewall 14. The plurality of circuit board insertion and assembly slots 26 that are located and formed interposed between the plurality of ribs 27 is intended to assist in the positioning, inserting and assembling of circuit boards within the circuit board chassis 10 of FIG. 1A. To that end, the plurality of ribs 27 typically have: (1) a depth protruding into the circuit board chassis 10 from about 5 to about 20 millimeters; (2) a width along the third sidewall 16 or the fourth sidewall 18 of the circuit board chassis 10 from about 5 to about 20 millimeters; and (3) a separation distance along the third sidewall 16 or the fourth sidewall 18 of the circuit board chassis 10 from about 5 to about 20 millimeters, that is otherwise generally conventional, and intended to accommodate circuit boards and related circuit board fasteners that are otherwise also generally conventional. Under certain circumstances, the plurality of circuit board insertion and assembly slots 26 and the plurality of ribs 27 may also be included on interior portions of the first sidewall 12 and the second sidewall 14.

Finally, FIG. 1A also further illustrates more narrowly spaced and dimensioned slots and ribs located and formed upon the outer surfaces of the third sidewall 16 and the fourth sidewall 18. These vertically arranged and more narrowly spaced (i.e., from about 2 millimeters to about 5 millimeters) and dimensioned (i.e., from about 2 millimeters to about 5 millimeters thickness and from about 5 to about 20 millimeters depth to a core of the third sidewall 16 or the fourth sidewall 18) slots and ribs are intended to assist with thermal dissipation from circuit boards and a backplane assembled within the circuit board chassis 10 whose schematic isometric-view diagram is illustrated in FIG. 1A. Thus, the circuit board chassis 10 may be passively cooled through conduction cooling. This particular passive conduction cooling is common and preferred, but not limiting, within the circuit board chassis 10 of the instant embodiment.

Alternatively, the circuit board chassis 10 may be cooled while using active cooling means such as but not limited to air cooling means (i.e., which would commonly include a fan or other air handling mechanism) and liquid cooling means (i.e., which would commonly include a heat exchanger).

The circuit board chassis 10 of FIG. 1A may be fabricated and assembled using methods that are otherwise generally conventional in the circuit board chassis design, fabrication and assembly art. Such methods may include, but are not necessarily limited to machining methods, brazing methods and mechanical assembly methods that use subcomponent parts for fabricating and assembling the circuit board chassis of FIG. 1A. Typically, the circuit board chassis of FIG. 1A is fabricated and assembled using at least subcomponent sidewall parts.

Also contemplated is an embodiment of a circuit board chassis where a pair of slots that correlates with the counter-opposed pair of backplane insertion and assembly slots 25 is located and formed primarily, or completely, within the third sidewall 16 and the fourth sidewall 18, and not specifically within the first sidewall 12 (although the aperture 24 is still located and formed within the first sidewall 12). Such a pair of slots may be fabricated incident to an enlargement or tapering of the aperture 24. Such a pair of slots may further ease insertion and assembly of a backplane within those slots that correlate with the counter-opposed pair of backplane insertion and assembly slots 25.

Such an embodiment of a circuit board chassis with these alternative slots is illustrated within the schematic isometric-view diagram of FIG. 1B, which illustrates generally a circuit board chassis 10'. The circuit board chassis 10' of FIG. 1B otherwise correlates with the circuit board chassis 10 of FIG. 1A (i.e., like or identical components and structures are designated with identical reference numerals), but the aperture 24 as illustrated in FIG. 1A is enlarged to form an aperture 24' so that a counter-opposed pair of backplane insertion and assembly slots 25' (i.e., of which only one is visible) that correlate with the counter-opposed pair of backplane insertion and assembly slots 25 that is illustrated in FIG. 1A is located and formed primarily, or completely, within the third sidewall 16 and the fourth sidewall 18.

Further discussion and illustration of the embodiments will be directed towards the circuit board chassis 10 of FIG. 1A rather than the circuit board chassis 10' of FIG. 1B, although each of the circuit board chassis 10 of FIG. 1A and the circuit board chassis 10' of FIG. 1B provides an operative embodiment.

Figure 2A:
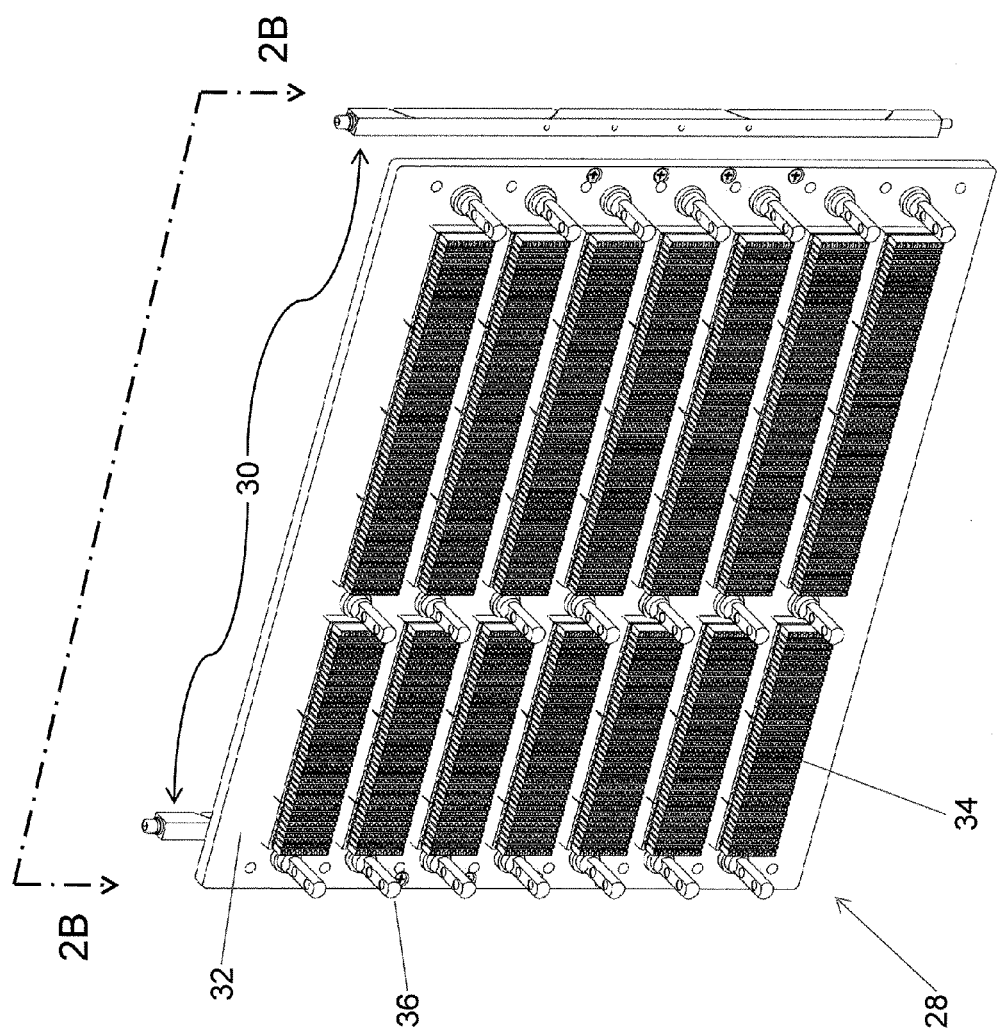
FIG. 2A shows a schematic isometric-view diagram of a backplane and a plurality of wedge lock assemblies that may be inserted into and assembled to the circuit board chassis whose schematic isometric-view diagram is illustrated in FIG. 1A or FIG. 1B.

FIG. 2A shows a schematic isometric-view diagram of a backplane 28 generally, and wedge-lock assemblies 30 that may be inserted and assembled into the circuit board chassis 10 of FIG. 1A through the aperture 24 within the first sidewall 12 within the circuit board chassis 10 of FIG. 1A.

FIG. 2A shows more particularly that the backplane 28 comprises a backplane substrate 32 upon which is located and assembled a plurality of circuit board connectors 34 and a plurality of alignment pins 36.

The backplane substrate 32 (i.e., which is generally similar to a circuit board substrate) typically comprises a multi-layer laminate that includes patterned conductor layers that are separated by dielectric layers. Commonly, but not exclusively, the patterned conductor layers comprise copper, copper alloy, aluminum or aluminum alloy conductor materials. Commonly, but not exclusively, the dielectric layers comprise a resin impregnated material, such as but not limited to a fiberglass material.

The circuit board connectors 34 are otherwise generally conventional, and sized appropriately for particular circuit boards.

The alignment pins 36 are intended to assist with registration of individual circuit boards with respect to individual circuit board connectors 34 on the backplane 28. To that end, the alignment pins 36 may comprise any of several materials, including but not limited to conductor materials and dielectric materials, but are generally fabricated of sufficient mechanical integrity to assist with ease of insertion and removal of a circuit board with respect to a particular circuit board connector 34.

Although not particularly illustrated within the schematic diagram of FIG. 2A, the backplane 28 may comprise any of several conventional or non-conventional designs. Conventional designs are often designated as VPX, VME, Compact PCI and micro TCA designs, among other particular conventional designs. A particular backplane is typically selected within the context of particular functionality desired or required within the context of particular circuit boards that are intended to be inserted and assembled to the particular backplane.

The wedge-lock assemblies 30 are of otherwise generally conventional design and construction. Thus, the wedge-lock assemblies 30 comprise counter-opposed wedge components which when drawn to each other by means of a lineal contraction force will offset and wedge the backplane 28 within the counter-opposed pair of backplane insertion and assembly slots 25 that begin within the sidewalls of the aperture 24 within the first sidewall 12 of the circuit board chassis 10 of FIG. 1A, as will be illustrated in further detail below.

Figure 2B:
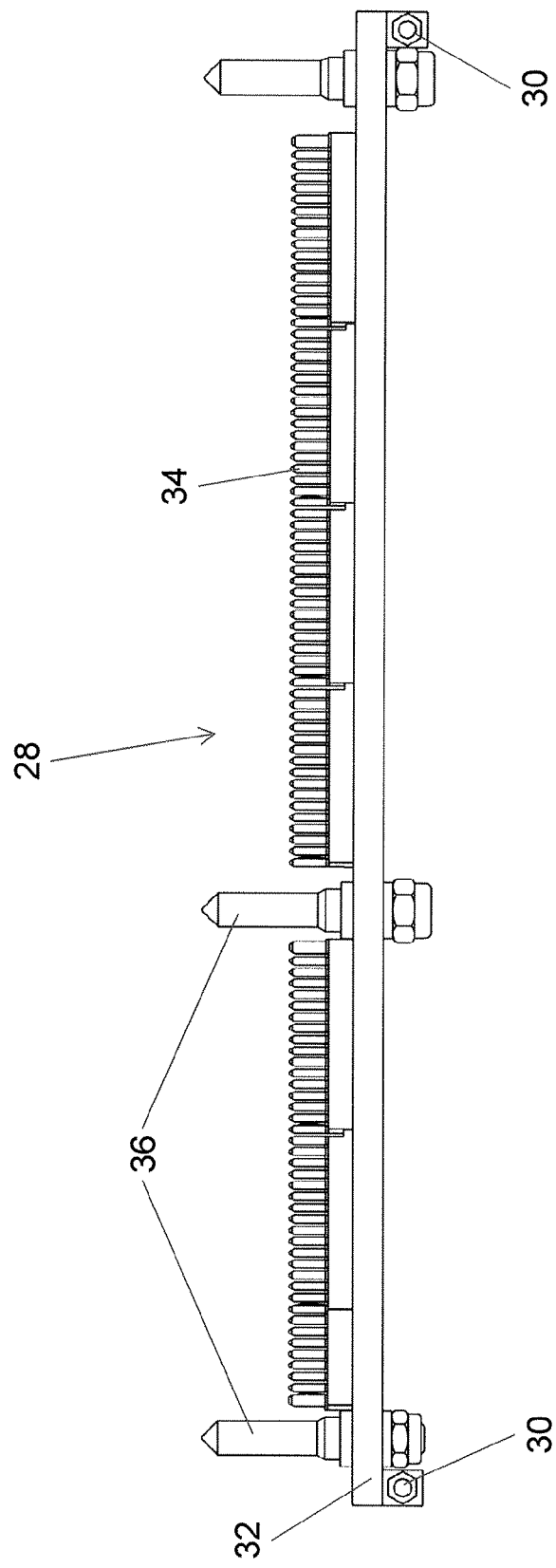
FIG. 2B shows a schematic end-view diagram of the backplane and the plurality of wedge lock assemblies in accordance with FIG. 2A, that may be inserted into and assembled to the circuit board chassis whose schematic isometric-view diagram is illustrated in FIG. 1A or FIG. 1B.

FIG. 2B shows a schematic end-view diagram of the backplane 28 and wedge-lock assemblies 30 that are illustrated in FIG. 2A.

Figure 3:
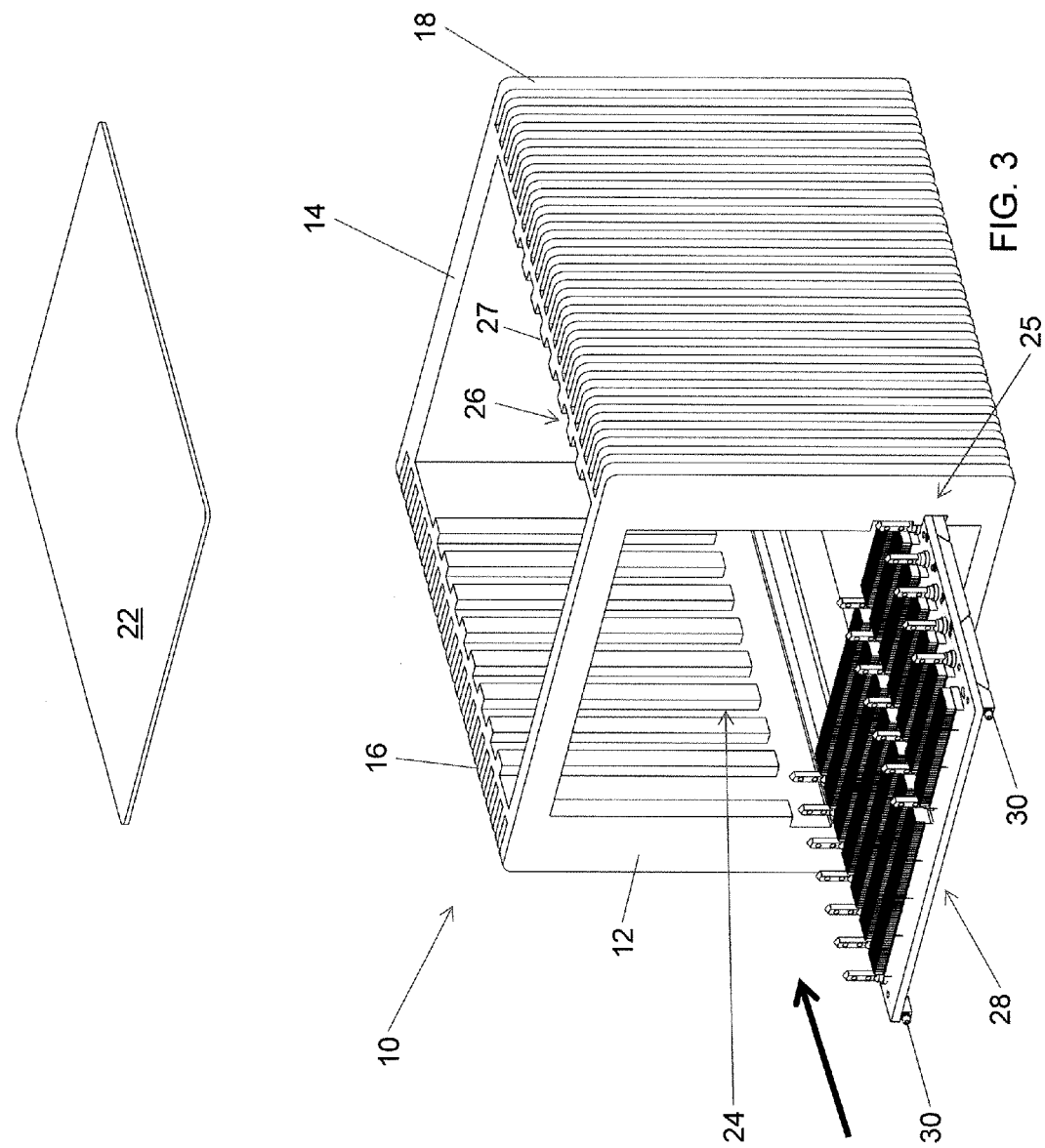
FIG. 3 shows a schematic isometric-view diagram illustrating insertion and assembly of the backplane and wedge lock assemblies of FIG. 2A and FIG. 2B into the circuit board chassis whose schematic isometric-view diagram is illustrated in FIG. 1A.

As is illustrated in FIG. 2B, the wedge-lock assemblies 30 are now assembled to the backside of the backplane substrate 32. The alignment pins 36 and the circuit board connectors 34 are also illustrated within the schematic cross-sectional diagram of FIG. 2B. FIG. 3 shows the circuit board chassis 10 of FIG. 1A into which now is inserted and assembled the backplane 28 with the wedge-lock assemblies 30 assembled thereto, into the counter-opposed pair of backplane insertion and assembly slots 25 and through the aperture 24 within the first sidewall 12 of the circuit board chassis 10. When the wedge-lock assemblies 30 are in an uncontracted position, the backplane 28 with the wedge-lock assemblies 30 assembled thereto may simply be slid into the circuit board chassis 10 through the counter-opposed pair of backplane insertion and assembly slots 25 that comprise the sidewall portions of the aperture 24, as well as interior portions of the third sidewall 16 and the fourth sidewall 18, as will be illustrated in further detail below.

FIG. 4 shows an end-view of the circuit board chassis of FIG. 3 after the backplane 28 with the wedge-lock assemblies 30 assembled thereto has been completely inserted and assembled into the counter-opposed pair of backplane insertion and assembly slots 25 and through the aperture 24.

As is understood by a person skilled in the art, while FIG. 2B and FIG. 3 illustrate the wedge-lock assemblies 30 assembled to the backplane 28, alternatively the wedge-lock assemblies may be assembled to the counter-opposed pair of backplane insertion and assembly slots 25 that extend into the circuit board chassis 10 beginning at the aperture 24 sidewalls.

As is illustrated in FIG. 3, the wedge-lock assemblies 30 are located assembled to the backplane substrate 32 portion of the backplane 28. The wedge-lock assemblies 30 and backplane 28 are inserted into the counter-opposed pair of backplane insertion and assembly slots 25 that begin at the sides of the aperture 24. Contraction of the wedge-lock assemblies 30 causes for the wedge-lock assemblies 30 and the backplane substrate 32 to become wedged in the counter-opposed pair of backplane insertion and assembly slots 25 that begin at each side of the aperture 24. Thus, the counter-opposed pair of backplane insertion and assembly slots 25 is sized to accommodate freely the backplane 28 and wedge-lock assemblies 30 when the wedge-lock assemblies 30 are uncontracted, but also to clamp the backplane 28 when the wedge-lock assemblies 30 are contracted.

FIG. 5 shows the circuit board chassis 10 of FIG. 3, into which the backplane 28 has been completely inserted and assembled. However, FIG. 5 also illustrates a circuit board 38 (i.e., including circuit components 39, connectors 40 and a support frame 41 assembled thereto) and associated wedge-lock assemblies 31 assembled thereto that is inserted and assembled into the circuit board chassis 10 and the backplane 28 (i.e., after the backplane 28 is completely inserted and assembled into the circuit board chassis 10). The circuit board 38 is inserted and assembled in a direction perpendicular to the direction of insertion and assembly of the backplane 28, and with the assistance of the circuit board insertion and assembly slots 26 (and also the alignment pins 36 on the backplane 28).

The circuit board 38 is otherwise generally conventional in the circuit board design, fabrication and assembly art, and selected to mate appropriately with a particular backplane 28. The circuit board 38 typically comprises circuit board substrate materials analogous, equivalent or identical to substrate materials that are used for fabricating the backplane substrate 32 that comprises the backplane 28. Typically, the circuit board 38 will comprise a plurality of circuit components 39.

The circuit components 39 are also otherwise generally conventional, and are generally provided as circuit modules that may include, but are not necessarily limited to, resistors, transistors, diodes and capacitors. Circuit components 39 that include discrete electrical components rather than circuit modules are also not excluded within the embodiments.

The connectors 40 located and assembled to the circuit board 38 are also generally conventional in the circuit board design, fabrication and assembly art. To that end, the connectors 40 are intended to mate specifically with the connectors 34 located and assembled to the backplane 28.

The frame 41 is also generally conventional in the circuit board design, fabrication and assembly art. The frame 41 provides mechanical support to the circuit board 38, and as well may assist in thermal dissipation from the circuit board 38.

Finally, the wedge-lock assemblies 31 are otherwise generally related to the wedge-lock assemblies 30 associated with the backplane 28, but sized appropriately to operate effectively with the circuit board 38 and the circuit board insertion and assembly slots 26, rather than the counter-opposed pair of backplane insertion and assembly slots 25 within the aperture 24 sidewalls and extending into the circuit board chassis 10.

As is noted above, the embodiment provides value insofar as the insertion and assembly of the backplane 28 into the aperture 24 and counter-opposed pair of backplane insertion and assembly slots 25 that extend into the circuit board chassis 10 from the first sidewall 12 of the circuit board chassis 10 provides flexibility within the context of sequentially inserting and assembling the backplane 28 and the circuit board 38 into the circuit board chassis 10. Such flexibility is particularly desirable when the circuit board chassis 10 is positioned with constrained space limitations and under circumstances where the backplane 28 is otherwise assembled as an outer surface assembly of the circuit board chassis 10.

Moreover, and as is also noted above, the embodiment provides value under the foregoing outer surface assembly circumstances with or without constrained space limitations insofar as the inventive sidewall aperture 24 and counter-opposed pair of backplane insertion and assembly slots 25 assembly of the backplane 28 with wedge-lock assemblies 30 provides the circuit board chassis 10, with the backplane 28 so assembled therein, with enhanced mechanical characteristics such as enhanced rigidity and assembly speed, as well as enhanced thermal transfer characteristics.

As is understood by a person skilled in the art, the foregoing embodiments that derive from FIG. 1A and FIG. 1B are not intended as limiting within the context of the counter-opposed pair of backplane insertion and assembly slots 25 that are illustrated in FIG. 1A or the counter-opposed pair of backplane insertion and assembly slots 25' that are illustrated in FIG. 1B. Rather, the foregoing embodiments also contemplate guide means other than slots for sidewall insertion and assembly of a backplane into a circuit board chassis, such as the circuit board chassis 10 of FIG. 1A or the circuit board chassis 10' of FIG. 1B. Such alternative guide means may include, but are not necessarily limited to circuit board guide rails sized to accommodate a thickness of a circuit board absent wedge-locks installed. These alternative guide means may be adapted with alternative clamping means, such as but not limited to leaf springs or other spring-like clamping means.

In addition similar considerations apply for the circuit board insertion and assembly slots 26, which may also be replaced by alternative circuit board guide means, such as but not limited to circuit board guide rails sized to accommodate a thickness of a circuit board absent wedge-locks installed. These alternative circuit board guide means may also be adapted with alternative clamping means, as described above.

The embodiments are illustrative of the invention rather than limiting of the invention. Revisions and modifications may be made to materials, structures and dimensions of a circuit board chassis and related method in accordance with the embodiments, while still providing a circuit board chassis and related method in accordance with the invention, further in accordance with the accompanying claims.

What is claimed is:

1. A circuit board chassis comprising:
an enclosure comprising a first sidewall and a second sidewall that are counter-opposed, and connected to and separated by a third sidewall and a fourth sidewall that are counter-opposed, and connected to and separated by the first sidewall and the second sidewall, at least one of the first sidewall, the second sidewall, the third sidewall and the fourth sidewall including an aperture having a height dimension and a width dimension designed to accommodate insertion and assembly of a backplane into the circuit board chassis in a first direction through the aperture; and at least one circuit board guide means incorporated into at least one of the first sidewall, the second sidewall, the third sidewall, the fourth sidewall and the backplane having a depth dimension and a width dimension designed to accommodate insertion and assembly of a circuit board into the circuit board chassis and the backplane in a second direction perpendicular to the first direction.

2. The circuit board chassis of claim 1 wherein the backplane is selected from the group consisting of VPX, VME, Compact PCI and Micro TCA backplanes.

3. The circuit board chassis of claim 1 wherein the aperture is contained within only the first sidewall to accommodate insertion and assembly of the backplane in the first direction through the aperture.

4. The circuit board chassis of claim 1 further comprising a cover plate that bridges between a first end of the first sidewall, a first end of the second sidewall, a first end of the third sidewall and a first end of the fourth sidewall.

5. The circuit board chassis of claim 4 further comprising a bottom plate that bridges between a second end of the first sidewall, a second end of the second sidewall, a second end of the third sidewall and a second end of the fourth sidewall opposite the first end of the first sidewall, the first end of the second sidewall, the first end of the third sidewall and the first end of the fourth sidewall.

6. The circuit board chassis of claim 1 wherein the aperture in at least one of the first sidewall, the second sidewall, the third sidewall and the fourth sidewall includes at least one backplane guide means to accommodate insertion and assembly of the backplane into the circuit board chassis through the aperture.

7. The circuit board chassis of claim 6 wherein the backplane guide means comprises a counter-opposed pair of slots in the sidewalls of the aperture and extending into the circuit board chassis, the counter-opposed pair of slots sized to accommodate the backplane and a clamping means.

8. The circuit board chassis of claim 7 wherein the clamping means comprises a wedge-lock assembly.

9. The circuit board chassis of claim 1 wherein the circuit board guide means comprises a slot within at least one of the first sidewall, the second sidewall, the third sidewall and the fourth sidewall.

10. The circuit board chassis of claim 1 wherein the circuit board chassis comprises a conduction-cooled circuit board chassis.

11. A circuit board chassis comprising:

an enclosure comprising a first sidewall and a second sidewall that are counter-opposed, and connected to and separated by a third sidewall and a fourth sidewall that are counter-opposed, and connected to and separated by the first sidewall and the second sidewall, at least one of the first sidewall, the second sidewall, the third sidewall and the fourth sidewall including an aperture further including a counter-opposed pair of backplane insertion and assembly slots that extend into the circuit board chassis, the aperture having a height dimension and a width dimension designed to accommodate insertion and assembly of a backplane into the circuit board chassis in a first direction through the aperture; and at least one circuit board guide slot incorporated into at least one of the first sidewall, the second sidewall, the third sidewall and the fourth sidewall having a depth dimension and a width dimension designed to accommodate insertion and assembly of a circuit board into the circuit board chassis and the backplane in a second direction perpendicular to the first direction.

12. The circuit board chassis of claim 11 wherein the backplane is selected from the group consisting of VPX, VME, Compact PCI and Micro TCA backplanes.

13. The circuit board chassis of claim 11 wherein the aperture including the counter-opposed pair of backplane insertion and assembly slots is contained within only one of the first sidewall, the second sidewall, the third sidewall and the fourth sidewall.

14. The circuit board chassis of claim 13 wherein the counter-opposed pair of backplane insertion and assembly slots is sized to accommodate the backplane and a pair of wedge-lock assemblies.

15. A method for assembling a backplane and a circuit board into a circuit board chassis comprising:

inserting and assembling a backplane in a first direction through an aperture within a first sidewall within a circuit board chassis comprising:

an enclosure comprising the first sidewall and a second sidewall that are counter-opposed, and connected to and separated by a third sidewall and a fourth sidewall that are counter-opposed, and connected to and separated by the first sidewall and the second sidewall, the first sidewall including the aperture having a height dimension and a width dimension designed to accommodate insertion and assembly of the backplane into the circuit board chassis in the first direction through the aperture; and at least one circuit board guide means incorporated into at least one of the first sidewall, the second sidewall, the third sidewall and the fourth sidewall having a depth dimension and a width dimension designed to accommodate insertion and assembly of a circuit board into circuit board chassis and the backplane in a second direction perpendicular to the first direction; and inserting and assembling the circuit board into the circuit board chassis and the backplane in the second direction perpendicular to the first direction.

16. The method of claim 15 wherein the backplane is selected from the group consisting of VPX, VME, Compact PCI and Micro TCA backplanes.

17. The method of claim 15 wherein the inserting and assembling the backplane includes inserting and assembling the backplane into a counter-opposed pair of slots within the aperture sidewalls, where the counter-opposed pair of slots extends into the circuit board chassis.

18. The method of claim 17 wherein the inserting and assembling the backplane includes clamping the backplane within the counter-opposed pair of slots using a pair of wedge-lock assemblies.

19. A circuit board chassis comprising:

an enclosure comprising a first sidewall and a second sidewall that are counter-opposed, and connected to and separated by a third sidewall and a fourth sidewall that are counter-opposed, and connected to and separated by the first sidewall and the second sidewall, one of the first sidewall, the second sidewall, the third sidewall and the fourth sidewall including an aperture having a height dimension and a width dimension designed to accommodate insertion and assembly of a backplane into the circuit board chassis in a first direction through the aperture; and at least one circuit board guide means incorporated into at least one of the first sidewall, the second sidewall, the third sidewall, the fourth sidewall and the backplane having a depth dimension and a width dimension designed to accommodate insertion and assembly of a circuit board into the circuit board chassis and the backplane in a second direction perpendicular to the first direction.

* * * * *

UNITED STATES PATENT AND TRADEMARK OFFICE
CERTIFICATE OF CORRECTION

PATENT NO. : 8,446,722 B2
APPLICATION NO. : 12/879604
DATED : May 21, 2013
INVENTOR(S) : Michael L. Fowler It is certified that error appears in the above-identified patent and that said Letters Patent is hereby corrected as shown below:

In the Specification

Col. 1, line 5, enter the following section heading and paragraph before the BACKGROUND section heading:

STATEMENT OF GOVERNMENT INTEREST

This work derives from research under Government Contract No. WI5P7T-06-D-E401. The U.S. Government has rights in this invention.

Signed and Sealed this
Twenty-ninth Day of October, 2013

Teresa Stanek Rea
*Deputy Director of the United States Patent and Trademark Office*